United States Patent [19]
Hakey et al.

[11] Patent Number: 6,121,128
[45] Date of Patent: Sep. 19, 2000

[54] METHOD FOR MAKING BORDERLESS WORDLINE FOR DRAM CELL

[75] Inventors: Mark C. Hakey; Steven J. Holmes, both of Milton; David V. Horak, Essex Junction; Wendell P. Noble, Jr., Milton, all of Vt.

[73] Assignee: International Business Machines Corporation, Armonk, N.Y.

[21] Appl. No.: 09/398,659

[22] Filed: Sep. 17, 1999

Related U.S. Application Data

[62] Division of application No. 09/052,403, Mar. 31, 1998.

[51] Int. Cl.[7] ............................................... H01L 21/4763
[52] U.S. Cl. ........................ 438/620; 438/618; 438/637; 438/624; 438/587; 438/622; 438/645; 257/296; 257/905; 257/907; 257/908
[58] Field of Search ........................... 357/23.6; 257/302, 257/296; 437/192, 52; 438/618, 637, 624, 620, 639, 587, 595, 638, 622, 645

[56] References Cited

U.S. PATENT DOCUMENTS

| | | |
|---|---|---|
| 4,630,237 | 12/1986 | Miura et al. . |
| 4,959,698 | 9/1990 | Shinchi .................................. 357/23.6 |
| 5,001,525 | 3/1991 | Kenney . |
| 5,013,680 | 5/1991 | Lowrey et al. . |
| 5,055,898 | 10/1991 | Beilstein, Jr. et al. . |
| 5,064,777 | 11/1991 | Dhong et al. . |
| 5,081,559 | 1/1992 | Fazan et al. . |
| 5,115,289 | 5/1992 | Hisamoto et al. . |
| 5,168,073 | 12/1992 | Gonzalez et al. . |
| 5,188,975 | 2/1993 | Kojima et al. . |
| 5,198,384 | 3/1993 | Dennison . |
| 5,206,183 | 4/1993 | Dennison . |
| 5,214,603 | 5/1993 | Dhong et al. . |
| 5,219,778 | 6/1993 | Dennison et al. . |
| 5,250,457 | 10/1993 | Dennison . |
| 5,250,830 | 10/1993 | Yagishita et al. . |

(List continued on next page.)

OTHER PUBLICATIONS

Chung et al., Evaluation Of Borderless VIAS For Sub Half–Micron Technologies, VMIC Conf. 667–669, Jun. 1995.

IBM Technical Disclosure Bulletin, vol. 27, No. 7A Dec. 1984, pp. 3883–3886. "Double–Polysilicon High–Capacitance DRAM Cell."

IBM Technical Disclosure Bulletin, vol. 32, No. 4A Sep. 1989, pp. 398–399. "Method For Making A Dynamic Random–Access Memory Cell."

BU9–94–136—A Five Square Folded–Bitline DRAM Cell. Ser. No. 08/365,617, Filed: Dec. 28, 1994.

YO9–94–145—A Cross Point Four Square Folded Bitline Trench DRAM Cell.—Feb. 2, 1995.

*Primary Examiner*—Matthew Smith
*Assistant Examiner*—Belur Keshaven
*Attorney, Agent, or Firm*—William N. Hogg

[57] ABSTRACT

A semiconductor structure and method of making the same are disclosed which includes a DRAM cell which has a transistor which includes a gate. The gate includes an individual segment of gate conductor such as polysilicon on a thin dielectric material. The transistor further has a single crystal semiconductor substrate having a source/drain region. An active conducting wordline is deposited on top of and electrically contacting a segment gate conductor, the wordline being a conductive material having a top and sidewalls. Electrically insulating material completely surrounds the active wordline except where the active wordline contacts the segment gate conductor. The insulating material surrounding the active wordline includes silicon nitride overlying the top and surrounding a portion of the sidewalls thereof, and silicon dioxide surrounds the remainder of the side walls of the active wordline. A bitline contact contacts the source/drain region and the insulating material surrounding the active wordline to thereby make the bitline contact borderless to the wordline. A fully encased passing wordline is also provided which is spaced from and insulated from the segment gate conductor and the active wordline.

10 Claims, 8 Drawing Sheets

U.S. PATENT DOCUMENTS

| | | |
|---|---|---|
| 5,320,975 | 6/1994 | Cederbaum et al. . |
| 5,330,927 | 7/1994 | Lee . |
| 5,338,702 | 8/1994 | Kobeda et al. ......... 437/192 |
| 5,346,834 | 9/1994 | Hisamoto et al. . |
| 5,378,646 | 1/1995 | Huang et al. . |
| 5,382,540 | 1/1995 | Sharma et al. . |
| 5,386,131 | 1/1995 | Sato . |
| 5,416,349 | 5/1995 | Bergemont . |
| 5,429,976 | 7/1995 | Hong et al. . |
| 5,710,078 | 1/1998 | Tseng ......... 438/620 |
| 5,792,703 | 8/1998 | Bronner et al. ......... 438/586 |
| 5,831,301 | 11/1998 | Horak et al. ......... 257/302 |
| 5,891,799 | 4/1999 | Tsui ......... 438/624 |
| 5,959,319 | 9/1999 | Iwasa ......... 257/296 |
| 5,960,318 | 8/1999 | Peschke et al. ......... 438/637 |

METHOD FOR MAKING BORDERLESS WORDLINE FOR DRAM CELL

This application is a divisional of application Ser. No. 09/052,403, filed Mar. 31, 1998, and is related to application Ser. No. 09/052,538, filed Mar. 31, 1998, entitled "Process for Building Borderless bitline, Wordline and DRAM Structure and Resulting Structure".

FIELD OF THE INVENTION

This invention relates generally to DRAM cell design using transistors and semiconductor interconnection techniques, and more particularly to a conductive wordline for a DRAM cell and a method of making the same wherein the bitline contact is borderless to the wordline which is especially useful in folded-bitline architecture for DRAMs.

BACKGROUND OF THE INVENTION

Large numbers of DRAM cells must be interconnected with wordlines, and wordlines and spaces between wordlines are a factor in determining the size of a folded-bitline cell. Typically, wordlines are formed as thin films of a conductor, such as aluminum or polysilicon, deposited on insulating materials on the semiconductor surface and defined as lines photolithographically. Efforts to shrink wordlines and the spaces between wordlines are limited since both line widths and spaces cannot photolithographically be made smaller than the line width, for example, decreasing the line width usually increases the line-to-line spacing and so the overall wordline pitch is not improved. The cost of decreasing the photolithographic minimum dimension is high, and each such effort has defined succeeding generations of semiconductor products. In each generation of DRAM cells, the photolithographically defined wordline and/or it's associated space have thus been formed at the photolithographic minimum dimension. Each such effort has defined succeeding generations of semiconductor products. In each generation of DRAM cells, the photolithographically defined wordline and/or its associated space have thus been formed at the photolithographic minimum dimension.

In the folded-bitline DRAM cell design, both an active and as a passing wordline pass through each cell, as illustrated in commonly assigned U.S. Pat. No. 4,801,988 ("the '988 patent"), issued to D. M. Kenney, entitled "Semiconductor Trench Capacitor Cell with Merged Isolation and Node Trench Construction," and shown therein which is incorporated herein by reference. Crossing over trench capacitors 505A and 510A for a pair of cells in FIG. 1, are wordlines 515A and 520A. The space required for such a DRAM cell is a minimum dimension for each of the two wordlines in each cell and an additional minimum dimension for each space between each wordline. Thus the total minimum length of the traditional folded bitline cell is 4 minimum dimensions. The width of the cell is at least two minimum dimensions, of which one is for the components in the cell and the other is for a thick isolation (a trench capacitor can be a part of this isolation) in the space between cells. Thus, the minimum area of a traditional cell has been 8 square minimum dimensions, or 8 squares.

One approach to avoid the photolithographic limit is to provide a wordline formed of a conductive sidewall rail. The width of such rails is determined by the thickness of the deposited conductor, and this thickness can be significantly less than a minimum photolithographic dimension. Commonly assigned U.S. Pat. No. 5,202,272 ("the '272 patent"), issued to Hsieh, entitled "Field Effect Transistor Formed With Deep-Submicron Gate," and U.S. Pat. No. 5,013,680 ("the '680 patent"), issued to Lowrey, entitled "Process for Fabricating a DRAM Array Having Feature Widths that Transcend the Resolution Limit of Available Photolithography," all of which are incorporated herein by reference, teach methods of using a subminimum dimension conductive sidewall spacer rail to form a wordline.

One problem encountered in the use of such subminimum dimension spacer rail wordlines is the difficulty of precisely controlling the length of the device and the extent of lateral diffusion of the source and drain. For example, small variations of spacer thickness or lateral diffusion can result in a large variation in the length of the subminimum dimension channel. The result can be large leakage currents on the one hand and degraded performance on the other. The present invention avoids the difficulties of the subminimum dimension sidewall spacer rail wordlines of the prior art.

Moreover, many prior art structures and techniques for sublithographic wordlines and/or bitlines do not provide a bitline contact which is borderless to the wordline.

SUMMARY OF THE INVENTION

It is therefore an object of the present invention to provide a folded bitline DRAM cell with a photolithographically formed gate, the cell having an area of less than 8 squares with the bitline being borderless to the wordline. It is also a feature of the present invention that a minimum subdivision wordline makes approximately minimum individual gate segments with the bitline contact being borderless to the wordline.

It is still a further object of the present invention to provide a transistor with individual segment gate conductors and a subminimum dimension gate connector with the bitline contact being borderless to the wordline.

These and other objects of the invention are accomplished by a semiconductor structure comprising a DRAM cell which has a transistor which includes a gate. The gate includes an individual segment of gate conductor such as polysilicon on a thin dielectric material. The transistor further has a single crystal semiconductor substrate having a source/drain region. An active conducting wordline is deposited on top of and electrically contacting a segment gate conductor, the wordline being a conductive material having a top and sidewalls. Electrically insulating material completely surrounds the active wordline except where the active wordline contacts the segment gate electrodes. The insulating material surrounding the active wordline includes silicon nitride overlying the top and surrounding a portion of the sidewalls thereof, and silicon dioxide surrounds the remainder of the side walls of the active wordline. A bitline contact contacts the source/drain region and the insulating material surrounding the active wordline to thereby make the bitline contact borderless to the wordline. A fully encased passing wordline is also provided which is spaced from and insulated from the segment gate conductor and the active wordline.

BRIEF DESCRIPTION OF THE DRAWINGS

FIG. 16 is a top plan view of the next step after that shown in FIG. 15a;

DETAILED DESCRIPTION OF THE INVENTION

FIGS. 1 through 11 show diagrammatically the steps in forming a DRAM cell according to the present invention. The preferred and illustrated embodiments utilize a single crystal silicon wafer with silicon technology to form the cells, however, germanium, gallium arsenide or other semiconductor material could also be used. Never-the-less, silicon is the most widely and commonly used material, so the invention will be described with respect to the use of silicon.

The term horizontal as used herein is defined as a plane parallel to the conventional planar surface of the semiconductor chip or wafer, regardless of the orientation of the chip. The term vertical refers to a direction generally normal or perpendicular to the horizontal as defined above. Prepositions such as "on", "side", (as in "sidewall"), "higher", "lower", "over", and "under" are defined with respect to conventional planar surfaces being on the top surface of the chip or wafer, irrespective of the orientation of the chip.

The folded-bitline DRAM architecture is one example of an array of transistors for which the present invention is applicable. The present invention provides a DRAM cell with a transistor having a gate formed from an individual segment of gate conductor and has a length (within overlay tolerances) and a width of about 1 minimum dimension. A wordline interconnecting such segment gates and the space between the wordlines each have a subminimum dimension as a result of the wordline being formed by a directional etch of a conformal conductor along the sidewall. The wordline also is encased in a dielectric or insulating material which makes the wordline borderless to the bitline contact. While the formation of just two array transfer devices is shown, it is to be understood that the array has many cells formed this way which are interconnected.

The figures in the present invention show the steps and the process of fabricating a DRAM cell of the present invention. Initial process steps in the manufacture of the invention are illustrated in FIGS. 3–10 of commonly assigned U.S. Pat. No. 5,264,716 ("the '716 patent"), issued to D. M. Kenney entitled "Diffused Buried Plate Trench DRAM Cell Array," incorporated herein by reference. In the '716 patent, however, a whole wordline is defined by a masking step. The present invention individual rectangular or square gate stack segments instead of the whole wordline are defined by that masking step, each segment having only a single gate for a single transistor. Preferably the gate segments have dimensions of about 1 minimum dimension in each direction along the planar surface (or a little more) to accommodate overlay tolerances, and the gates are aligned to fill the minimum dimension space between trench capacitors.

Figure 1:
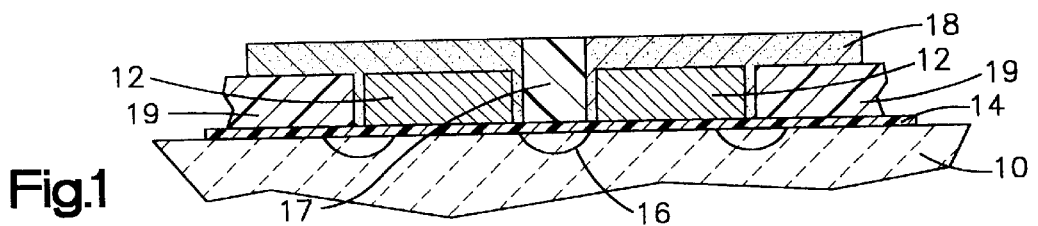
FIGS. 1–11 are longitudinal sectional views showing the steps in one embodiment of the invention utilized in manufacturing a DRAM cell having a transistor with active wordlines which are borderless to bitline contacts.

Referring now to the drawings, the steps in forming a DRAM cell including a transistor according to the present invention are shown. As seen in FIG. 1, a single crystal silicon substrate 10 is provided having polysilicon gates 12 formed thereon which are mounted on thin film dielectric material 14. The transistor is provided with a source/drain region one of which is shown at 16 and a deposit of silicon dioxide 17 is formed between the two gates 12 overlying the source/drain region 16. Dielectric material 19 is "behind" gates 12 as well as the sides thereof. (It is to be understood that other devices such as capacitors, straps, and connections are typically found in the substrate and form a part of the DRAM cell, but these are omitted for clarity of illustration.) A silicon nitride layer 18 which is preferably a 300–800 angstroms thick overlies the polysilicon gate electrodes 12. Typically the gates 12 are 500–1500 angstroms thick and the dielectric layer 14 is 50–80 angstroms thick. Vertical sides of gates which are shown in FIG. 1 are further surrounded by silicon nitride (spacers) 50–400 angstroms thick fully encasing the gate material 12.

Figure 2:
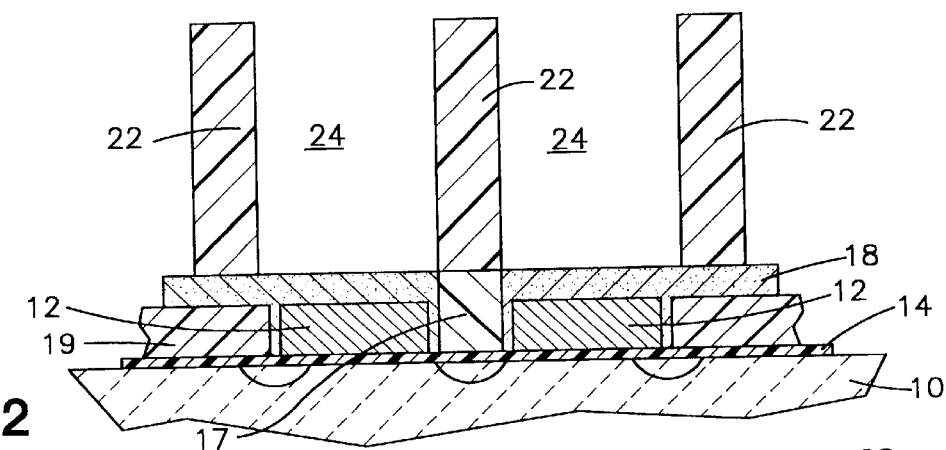

As shown in FIG. 2 a layer of silicon dioxide 22 4000–8000 angstroms thick is applied over the nitride layer 18 and by using a conventional photoresist and anisotropic etching techniques, a pattern in the photoresist is exposed and developed and the underlying silicon dioxide 22 is etched to provide openings 24 in the silicon dioxide. The silicon nitride 18 acts as an etch stop layer and the etching is done anisotropically using reactive ion etching (RIE techniques) all as are well known. As will become apparent later, these openings will provide the basis for two wordlines in one lithographic dimension.

Figure 3:
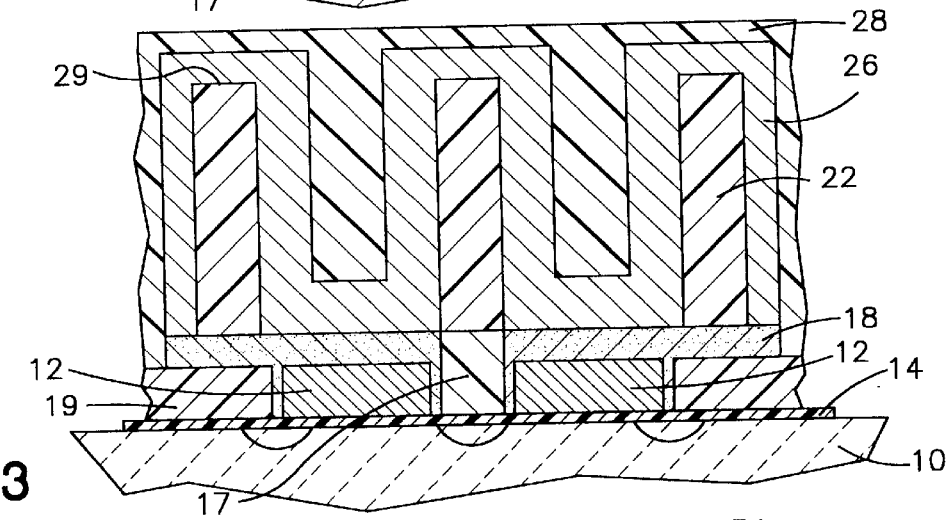
Figure 4:
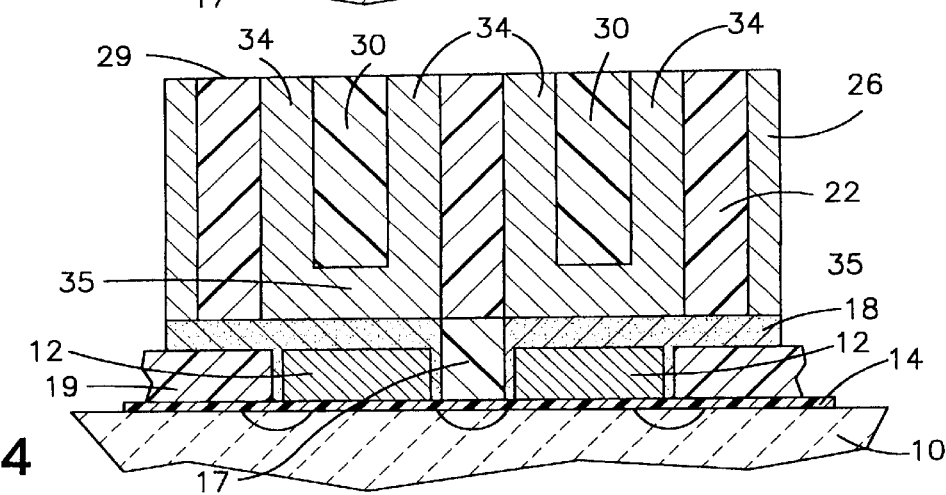

Following the etching of the openings 24 in the silicon dioxide 22 a conformal layer of silicon nitride 26 about 300–1300 angstroms thick is applied over the entire surface of the silicon dioxide 22, including the sidewalls of the openings 24 as shown in FIG. 3. A layer of silicon dioxide 28 is then deposited over the silicon nitride 26 and the surface polished back to remove the silicon dioxide and silicon nitride on the one surface 29 of the silicon dioxide 22 to provide the configuration shown in FIG. 4. This results in the conformal silicon nitride 26 being divided by a silicon dioxide filler material 30 into a pair of legs 34, which act as "place holders" for the wordline which will be formed later, connected by a U section 35 and a top planar surface 29. This is shown in FIG. 4.

Figure 5:
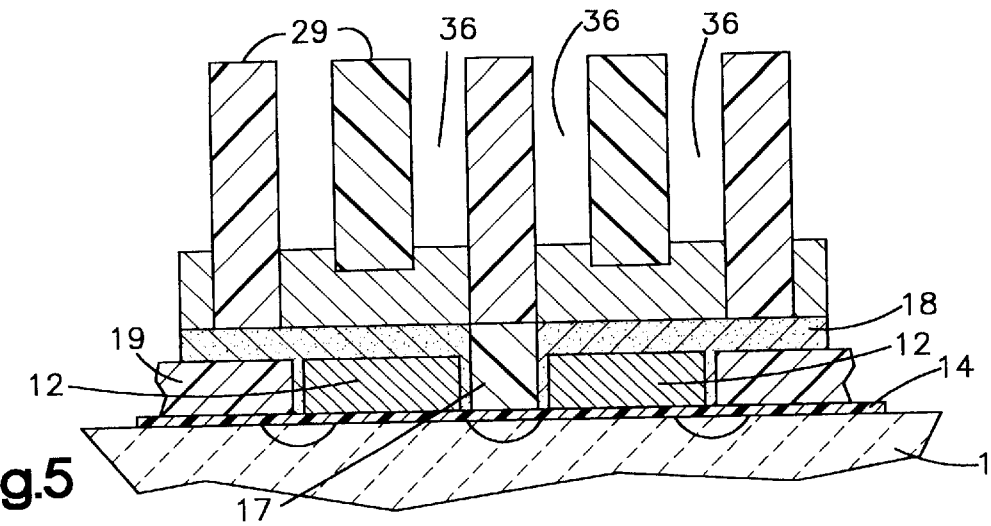
Figure 6:
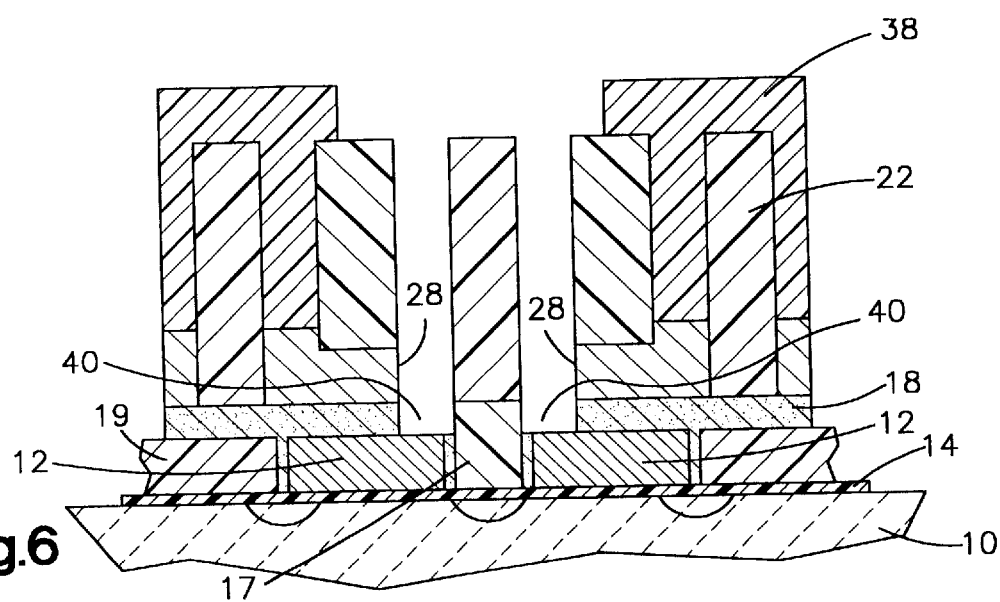

The planar surface 29 is then masked with conventional photoresist, patterned and the silicon nitride legs 34 are etched to provide the pair of openings 36 on either side of the silicon dioxide filler 30 as shown in FIG. 5. Although the silicon nitride place holders 34 now form a "loop", the resist mask will prevent the silicon nitride removal at the ends of loops outside of the array, thereby allowing non-connected passing and active wordlines. After etch, the resist mask is stripped. The silicon dioxide is again covered with photoresist 38 as shown in FIG. 6 which photoresist is then patterned and developed over the leg 34 which overlies the gate electrode 12, and the remaining silicon nitride in leg 34 that is to become the active wordline is etched to provide an opening 40 through the silicon nitride 35 and underlying silicon nitride 18 to the gate electrode 12 there below.

Figure 7:
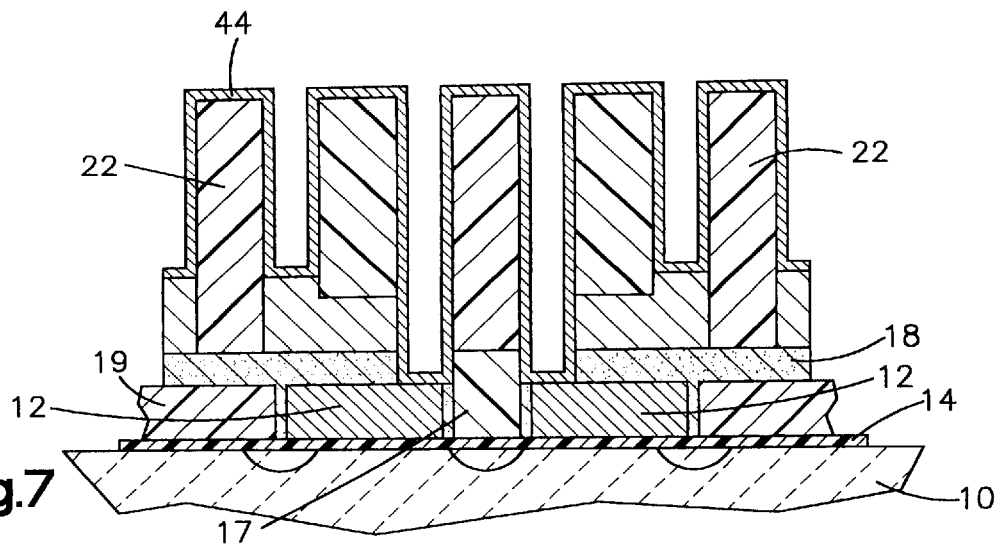

The photoresist 38 is then stripped and a conformal titanium nitride coating 44 is applied over all the exposed surfaces of the silicon dioxide 22 including the openings 40 and the top surface thereof as shown in FIG. 7.

Figure 8:
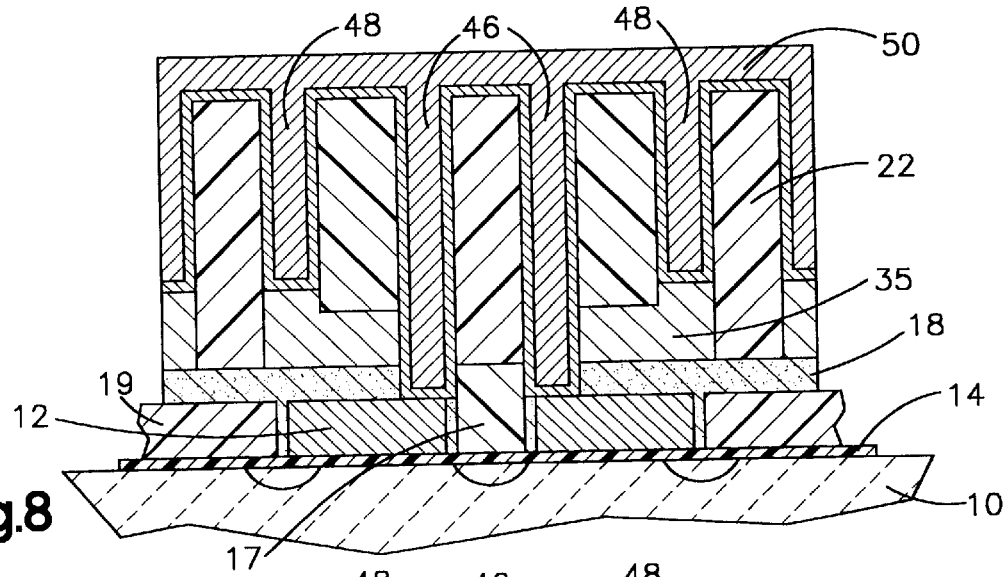

Following the application of the titanium nitride 44, a layer of aluminum is deposited over titanium nitride surface 44 which defines top coating 50 of aluminum with a pair of aluminum lines 46 and 48 as shown in FIG. 8. The lines 46 will contact the titanium nitride coating on the gate electrodes 12, thus providing contact thereto for the active wordline. Line 48 forms the passing wordline which is spaced from the gate electrode 12 by silicon nitride layers 18 and 35.

Figure 8A:
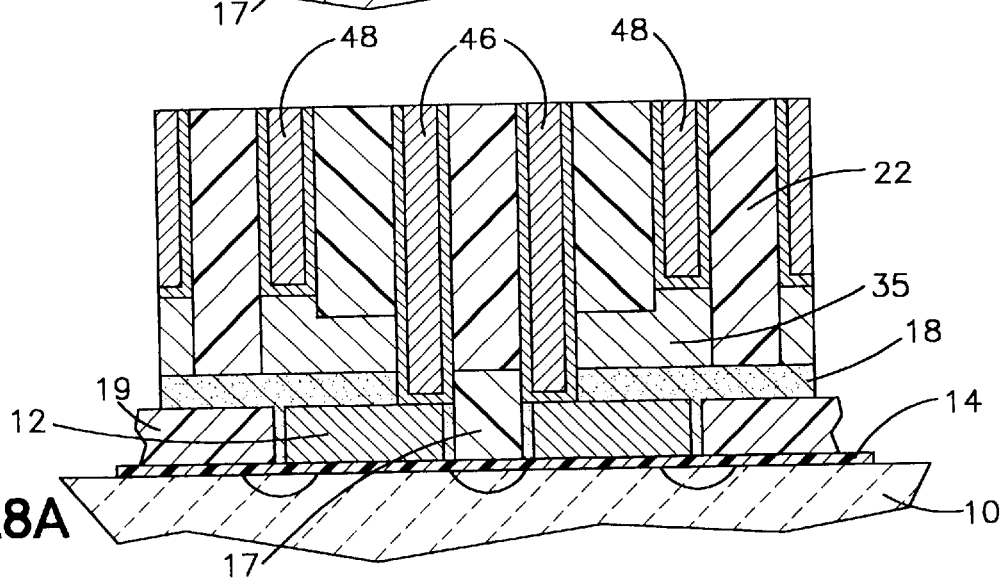

The top surfaces 50 of the aluminum and titanium nitride are then polished and the exposed lines 46 and 48 of the aluminum are shown in FIG. 8a.

Figure 9:
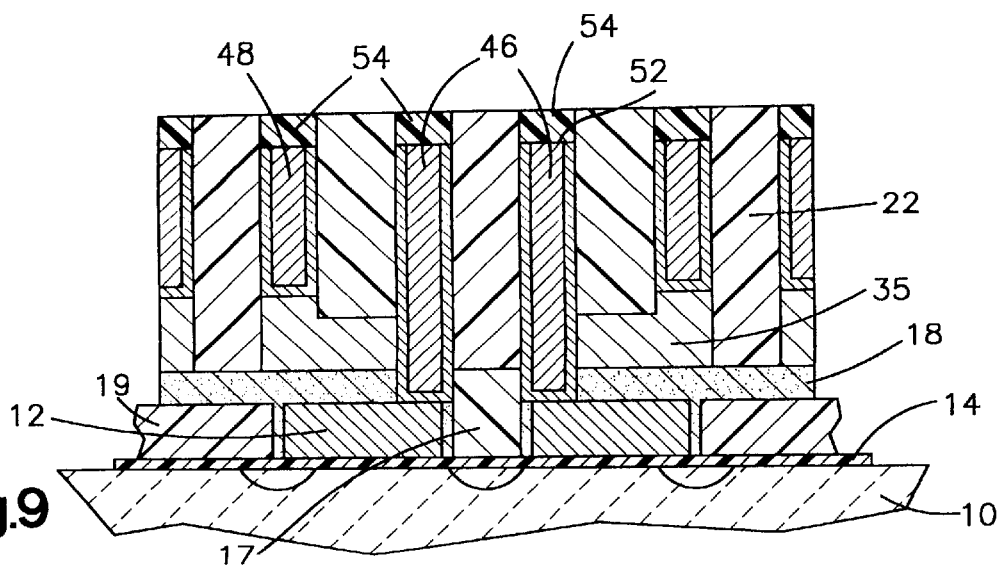

To make the wordline rails borderless to bitline contact, the exposed top surfaces of the aluminum lines 46 and 48 and titanium nitride are then etched with an etch media selective to the silicon dioxide so that the top surfaces 52 of the lines 46 and 48 are recessed within the silicon dioxide 22. Silicon nitride caps 54 are then deposited on the tops 52 of each of the aluminum lines 46 and 48 and polished as shown in FIG. 9.

Figure 9A:
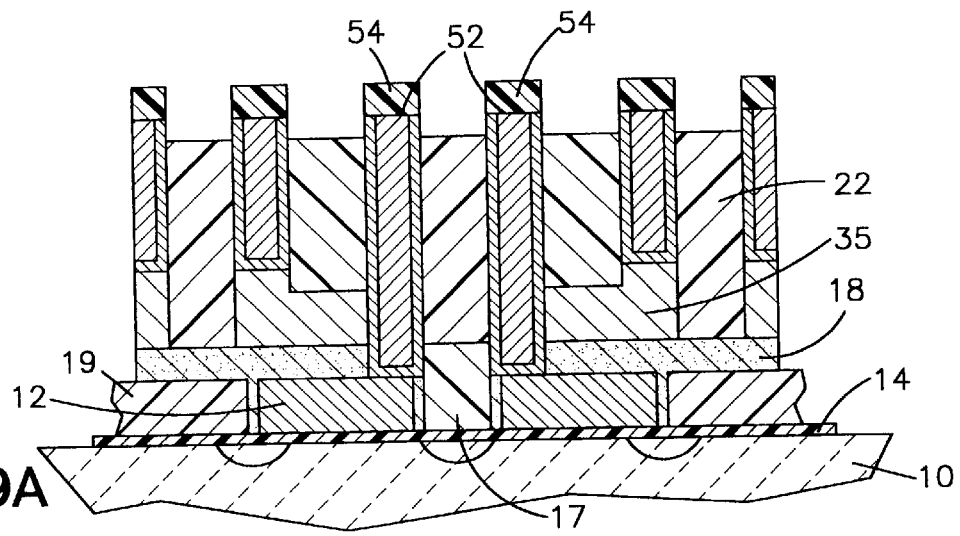

Silicon dioxide is then etched selectively to the silicon nitride 54 and the aluminum lines 46 and 48 to expose the nitride caps 54 and a portion of the sidewalls of the aluminum lines as shown in FIG. 9a.

Figure 10:
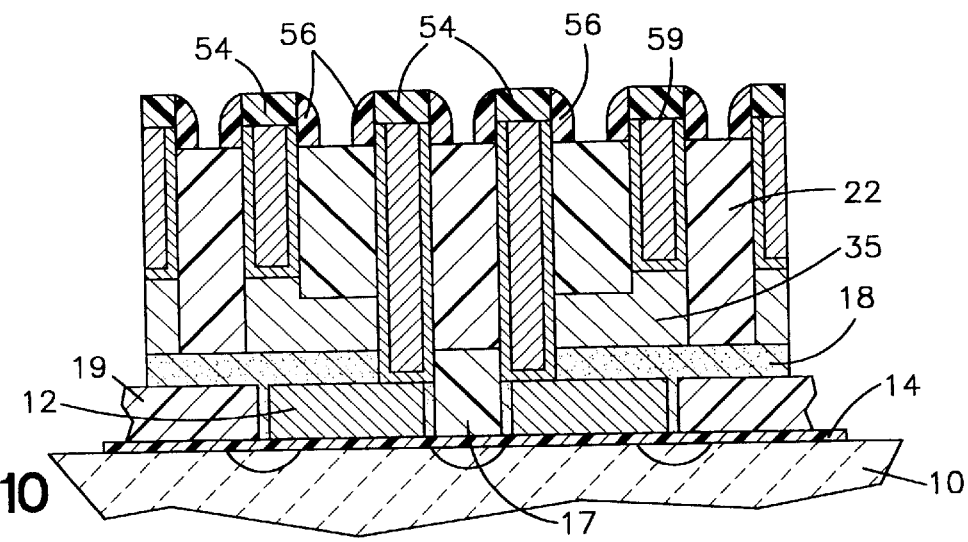

Following this, conformal silicon nitride 56 is deposited over the nitride caps 54 which extends down the side of each of the lines 46 and 48 and into contact with the top surface 59 of the silicon dioxide 22 and then non-isotropically etched to form spacers. This is shown in FIG. 10.

Figure 10A:
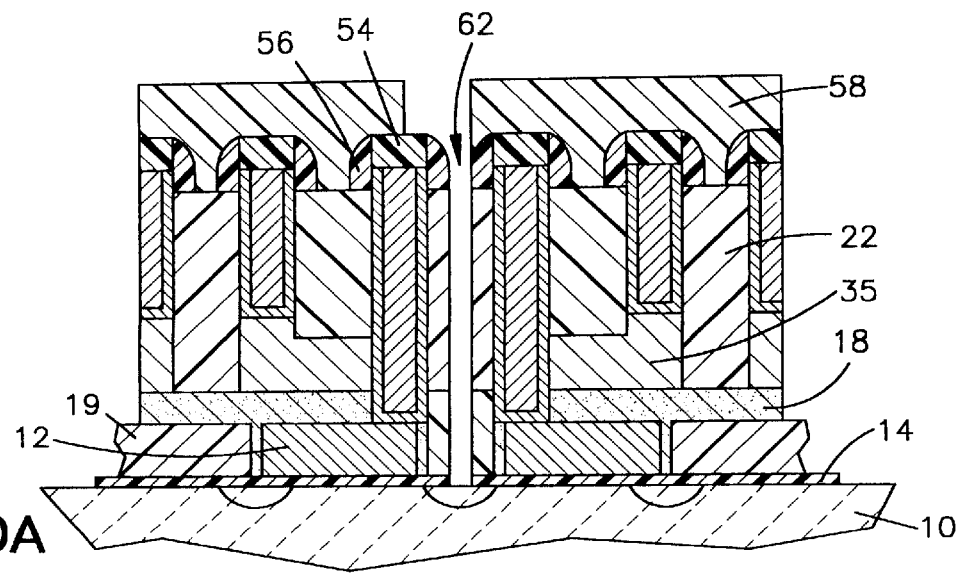

Thereafter, a layer of silicon dioxide 58 is CVD deposited over the entire exposed surface as shown in FIG. 10a. This silicon dioxide is then masked with photoresist, exposed, developed, and anisotropically etched to provide an opening 62 extending through to the source/drain region 16.

Figure 11:
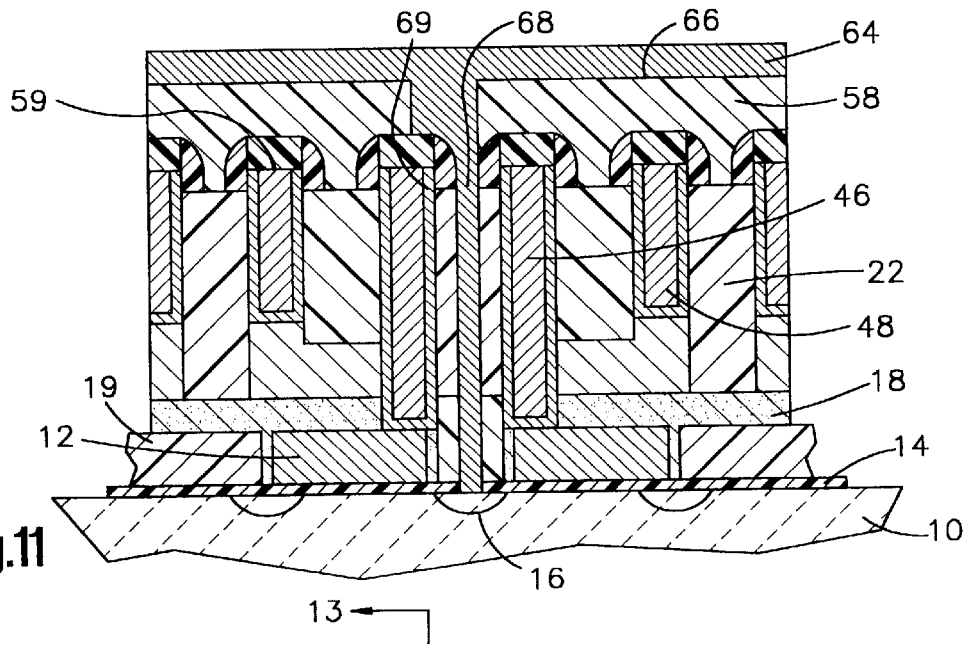

Connecting material 64 is then deposited on the top surface 66 of the silicon dioxide 58 and extends into the opening 62 to form a bitline contact 68 in contact with the source/drain region 16 as shown in FIG. 11. Connecting material 64 acts as the bitline contact, the aluminum line 46 acts as the active wordline, and aluminum line 48 acts as the passing wordline. Thus as can be seen, the bitline contact 68 can be somewhat misaligned as shown in FIG. 11, actually overlying and in contact with the insulating material surrounding the active wordline 46, the active wordline 46 being surrounded by the silicon nitride cap 56 and a portion of the silicon dioxide 22 adjacent the finger 46. Thus the bitline contact 68 is borderless to the active wordline 46 by virtue of the silicon nitride cap 56 and the section of silicon dioxide 22 on the active wordline 46 and enclosing it. Thus, two wordlines are contained within one photolithographic dimension reducing the number of squares per cell from 8 to less than 8 and approaching 4.

Figure 12:
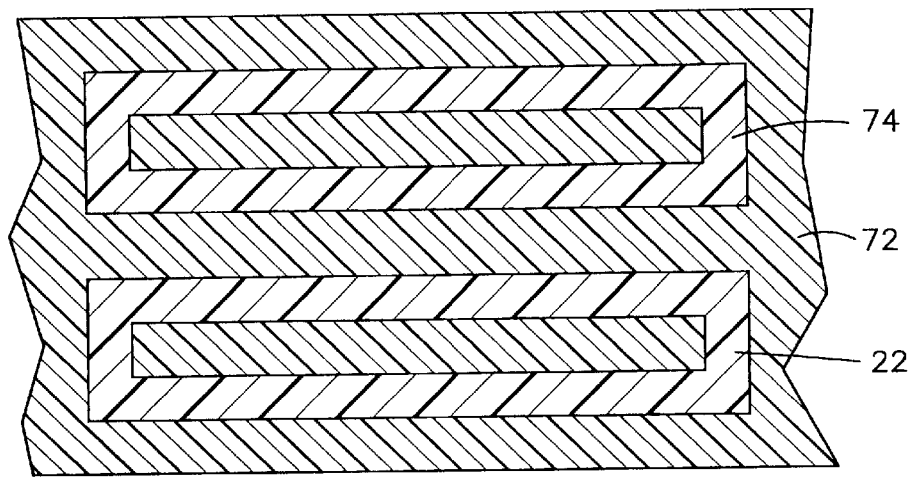
FIG. 12 is a top plan view of a first step in manufacturing a DRAM cell of the transistors according to another embodiment of this invention.
Figure 13:
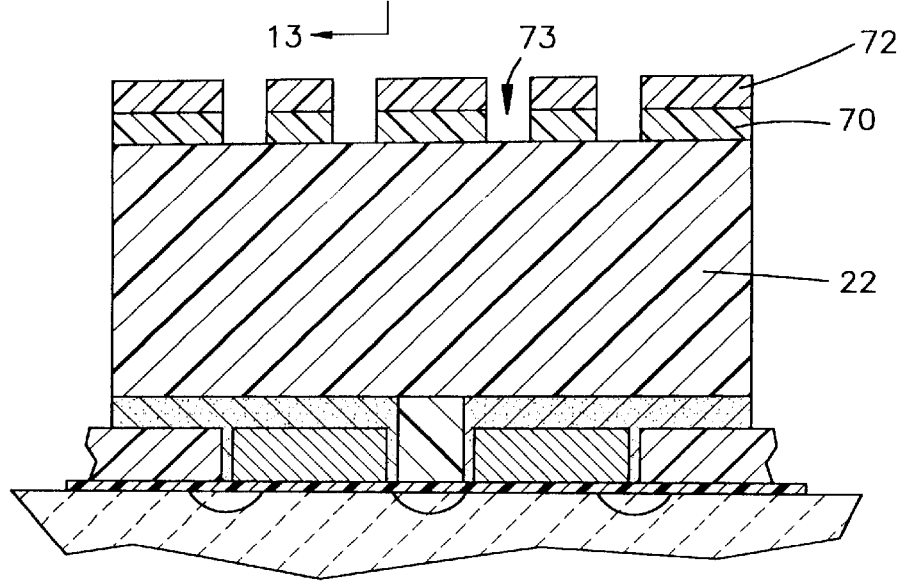
FIG. 13 is a longitudinal sectional view taken substantially along the plane designated by line 13—13 of FIG. 12.

Referring now to FIGS. 12–19, another embodiment of the present invention is shown. As shown in FIGS. 12 and 13, the substrate has the gate electrodes 12 and the nitride layer 18 deposited thereon with a coating of silicon dioxide 22 as in the previous embodiment in FIG. 1. However, in this embodiment, a poly silicon mask 70 is deposited over the silicon dioxide 22. A hybrid photoresist material 72 is applied over the polysilicon mask 70 and exposed and developed to the desired patterns for the active and passing wordlines and the underlying polysilicon mask 70 is selectively etched with respect to the photoresist to provide the openings 73 as shown in FIG. 13. The hybrid photoresist 72 is a combined positive/negative acting photoresist as described in commonly assigned U.S. patent application Ser. No. 08/715,287, Filed Sep. 16, 1996, entitled "Frequency Doubling Hybrid Photoresist", (which is incorporated herein by reference) which allows sublithographic spaces to be formed. However, the patterns are loop shaped having end portions 74 as well as the desired thin strips forming the openings 73.

Figure 14:
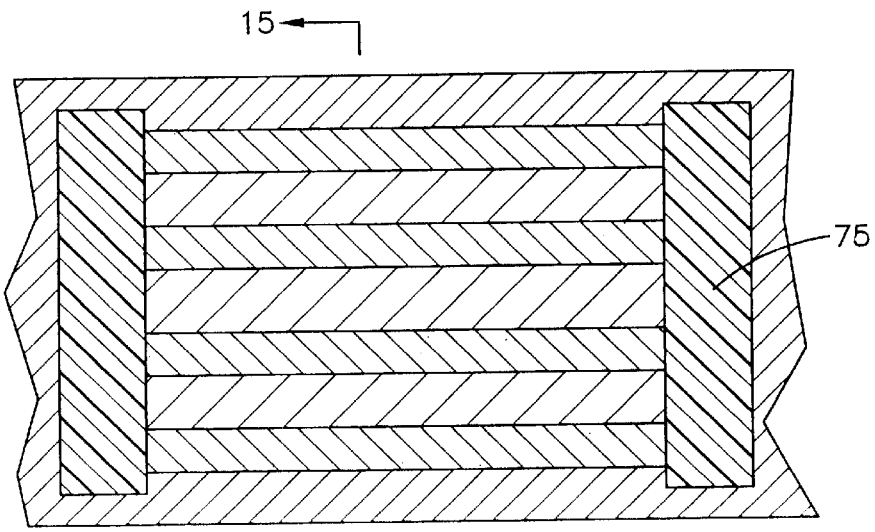
FIG. 14 is a top plan view of the next step following that shown in FIG. 13 in the manufacture of DRAM cell.
Figure 15:
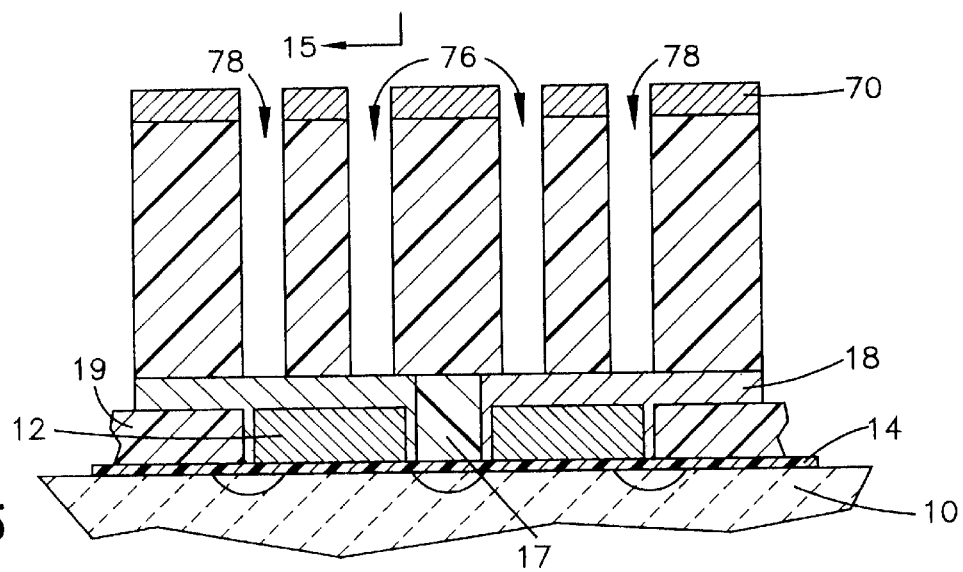
FIG. 15 is a sectional view taken substantial along the plane designated by line 15—15 of FIG. 14.
Figure 15A:
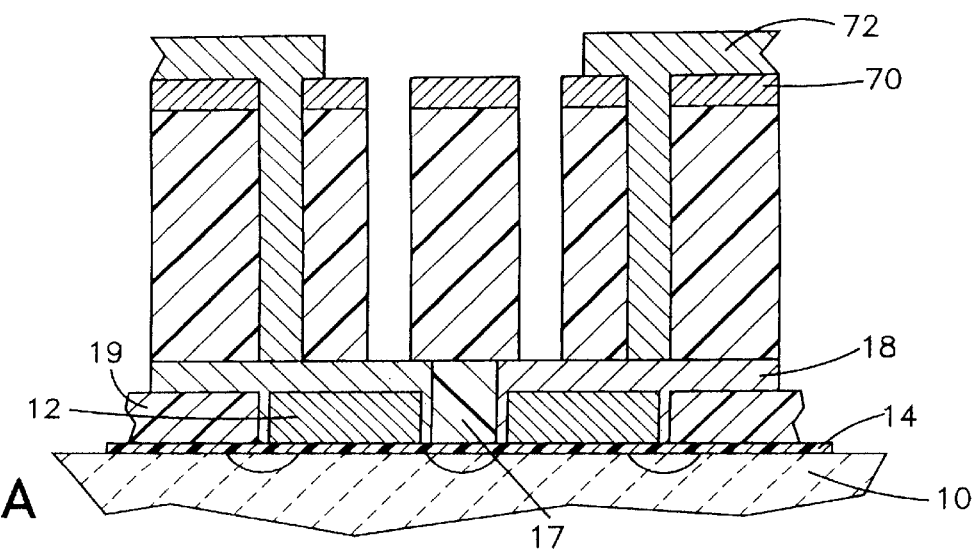
FIG. 15a is a longitudinal sectional view of the next step after that shown in FIG. 15 in this process.

In the next step as shown in FIGS. 14 and 15, trim mask 75 of conventional photoresist is applied over the end portions of 74 of the loops and the exposed underlying silicon dioxide 22 is etched selectively to the photoresist 72 and the polysilicon 70 to provide the openings 76 and 78 therein extending down to the nitride layer 18. The photoresist and polysilicon mask are then stripped.

Figure 16:
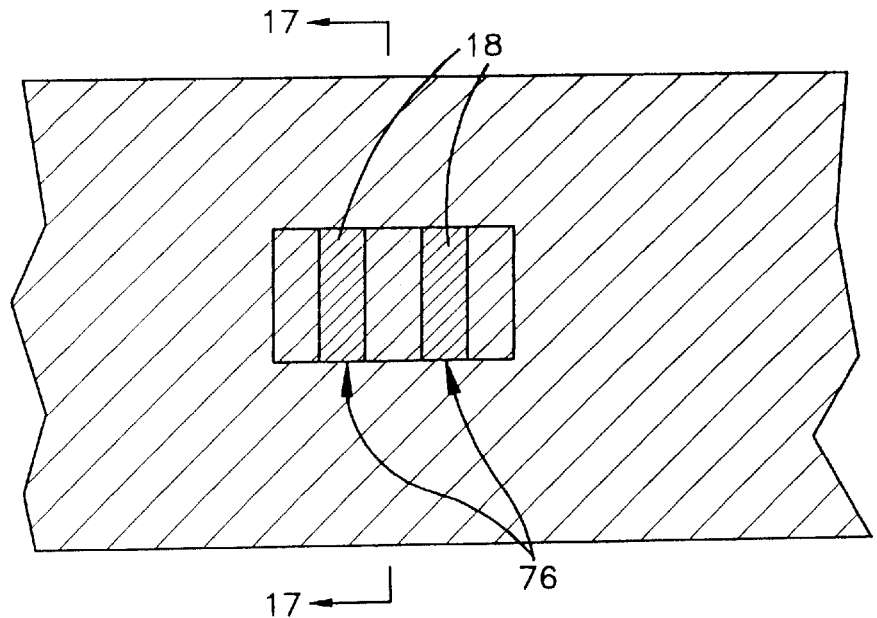
Figure 17:
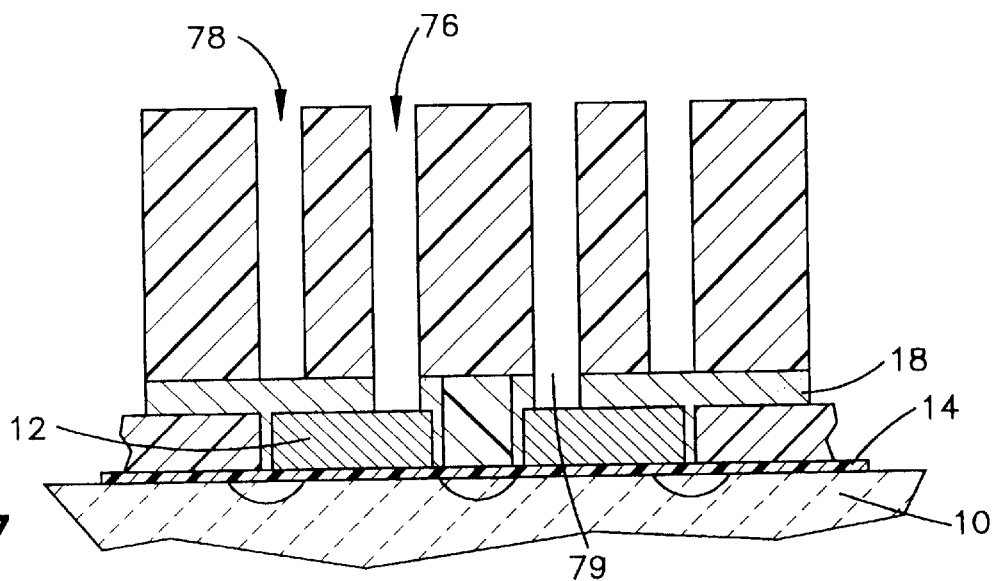
FIG. 17 is a longitudinal sectional view taken substantially along the plane designated by line 17—17 of FIG. 16.

Following this the entire structure is covered with photoresist and patterned and developed to open the openings 76 while leaving the openings 78 containing the photoresist 72. The silicon nitride layer 18 at the bottom of the openings 76 is then selectively etched to provide openings 79 to the gate polysilicon 12 as shown in FIGS. 16 and 17.

The titanium nitride is a conducting material and the layer is about 50–300 angstroms thick to guarantee shunting of aluminum with a thin layer on the sidewalls, and to guarantee a barrier layer between conductor material and the polysilicon gate if necessary.

Figure 18:
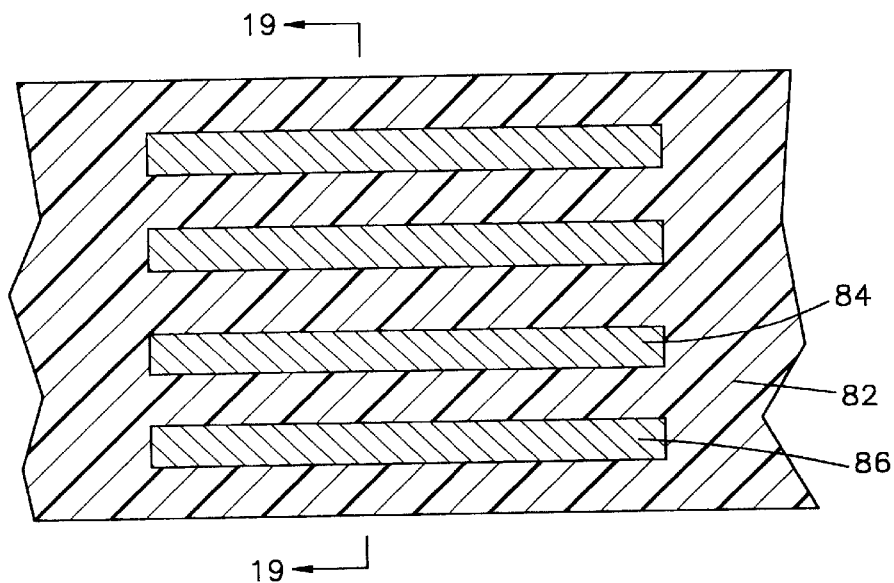
FIG. 18 is a top plan view of the next step in the manufacturing process after the step shown in FIG. 16.
Figure 19:
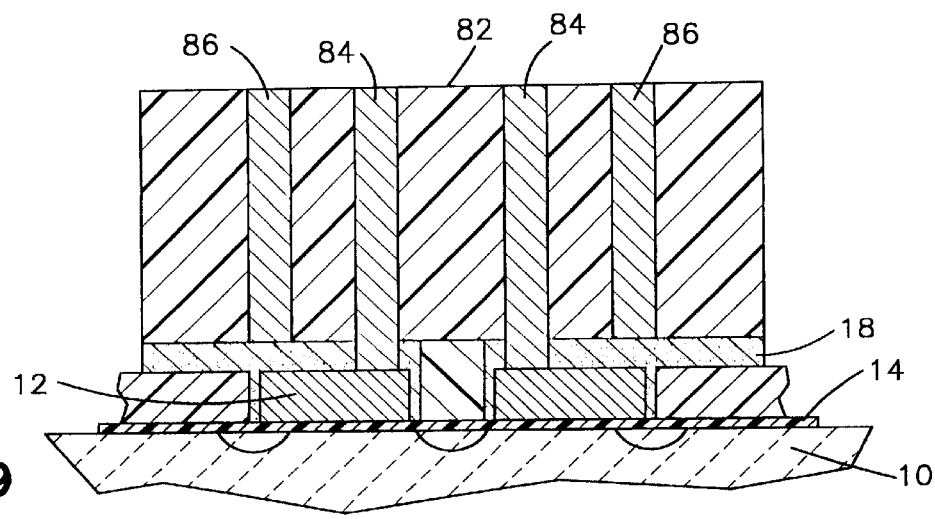
FIG. 19 is a longitudinal sectional view taken substantially along the plane designated by line 19—19 of FIG. 18.

Following this a conformal coating of aluminum is applied over the top surface 82 of the TiN, T over silicon dioxide 22 which aluminum also extends as lines 84 and 86 into openings 76 and 78 respectively, and Chem-mec polished to oxide 22. The aluminum lines 84 will act as the active wordlines and the lines 86 will act as the passing wordlines. The results are shown in FIG. 18 top down and in FIG. 19 cross section.

The processing from this point to provide a final product is the same as shown in the previous embodiments. With the structure shown in FIG. 19, corresponding to the structure shown in FIG. 8A.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed:

1. A method of forming a semiconductor structure comprising the steps of:

providing a single crystal semiconductor substrate;

forming a transistor device having a source/drain region and a gate electrode mounted on a thin film dielectric on said substrate;

forming a dielectric coating on said gate electrode;

forming an active wordline on said gate electrode in contact with said gate electrode having a terminating end portion and side portions extending from said terminating end portion;

forming an insulating material on said active wordline, said insulating material including silicon nitride overlying said terminating end portion and a part of the side portions of said active wordline adjacent the terminating end portion, and silicon dioxide surrounding the remainder of the side portions of said active wordline;

forming a bitline contact contacting said source/drain region and the insulating material surrounding said active wordline to thereby form said bitline contact borderless to said active wordline.

2. The invention as defined in claim 1 further characterized by forming a passing wordline of conductive material overlying and spaced from said gate electrode material, said passing wordline having a terminating end portion and side portions adjacent the terminating end portion surrounded by insulating material, said insulating material including silicon nitride overlying the terminating end portion of said passing wordline and parts of the side portions of said passing wordline, and silicon dioxide surrounding the remaining parts of said passing wordline.

3. The invention as defined in claim 2 further characterized by forming said active and said passing wordlines in a silicon dioxide coating into which openings had been etched.

4. The invention as defined in claim 3, wherein said openings in said silicon dioxide coating each have formed thereon one active and one passing wordline separated by silicon dioxide.

5. The invention as defined in claim 4, wherein said wordlines are formed by first defining a conformal coating in said opening, thereafter depositing two legs of said conformal coating in said opening, then depositing silicon dioxide between said two legs, thereafter removing a portion of one leg of said conformal coating and the entire other leg of said conformal coating, replacing each removed leg and portion of a leg of conformal coating with first and second legs of a conducting material with said first leg of conducting material being in contact with the gate electrode and the second leg insulated from and overlying said gate electrode to form said active and passing wordlines respectively.

6. The invention as defined in claim 5, wherein silicon nitride is deposited on the silicon dioxide in said opening for each leg after said conformal coating is removed and prior to the depositing of the conducting material.

7. The invention as defined in claim 3, wherein said silicon nitride portion of the insulating material overlying said ends portions of said wordlines is formed in part by etching said wordline selective to said layer of silicon dioxide, and thereafter depositing silicon nitride on the end portion of said wordline.

8. The invention as defined in claim 7, wherein said portions of the silicon nitride surrounding the side portions of said wordline are formed by etching the layer of silicon dioxide selection to the wordline after the silicon nitride has been formed on the ends thereof, and then depositing silicon nitride on the exposed side portion of said wordline and on the silicon nitride on the end portions of the wordlines.

9. The invention as defined in claim 8, wherein said bitline contact is formed after the depositing of the silicon nitride on the portion of the side of said wordlines by anisotropically etching said silicon dioxide to forming trench therein open to the source/drain region, and then depositing conducting material in said trench.

10. The invention as defined in claim 3 wherein a single opening in said silicon dioxide is utilized to form one and only one wordline.

* * * * *